(12) United States Patent
Maruyama et al.

(10) Patent No.: US 7,254,377 B2
(45) Date of Patent: Aug. 7, 2007

(54) PARALLEL OPERATION SYSTEM OF TRANSMISSION AMPLIFIER

(75) Inventors: Satoshi Maruyama, Kawasaki (JP); Osamu Mita, Kawasaki (JP); Yasuyuki Oishi, Kawasaki (JP); Tokuro Kubo, Kawasaki (JP); Norio Tozawa, Kawasaki (JP); Fumihiko Kobayashi, Kawasaki (JP)

(73) Assignees: Fujitsu Limited, Kawasaki (JP); NTT DoCoMo, Inc., Tokyo (JP)

( * ) Notice: Subject to any disclaimer, the term of this patent is extended or adjusted under 35 U.S.C. 154(b) by 1099 days.

(21) Appl. No.: 10/015,369

(22) Filed: Dec. 12, 2001

(65) Prior Publication Data

US 2003/0017813 A1 Jan. 23, 2003

(30) Foreign Application Priority Data

Jul. 17, 2001 (JP) ............................. 2001-216639

(51) Int. Cl.
*H04B 1/04* (2006.01)
(52) U.S. Cl. .................................... 455/127.3; 455/126
(58) Field of Classification Search .. 455/127.1–127.4, 455/103, 102, 126; 330/51
See application file for complete search history.

(56) References Cited

U.S. PATENT DOCUMENTS 5,038,404 A * 8/1991 Marz ........................... 455/118
5,793,817 A * 8/1998 Wilson ........................ 375/297
6,288,606 B1 * 9/2001 Ekman et al. ................. 330/51
6,498,925 B1 * 12/2002 Tauchi ....................... 455/115.1
6,798,844 B2 * 9/2004 Ratto .......................... 375/296

FOREIGN PATENT DOCUMENTS

| JP | 07-077330 | 3/1995 |
|---|---|---|
| JP | 09-069733 | 3/1997 |

* cited by examiner

*Primary Examiner*—Barry Taylor
(74) *Attorney, Agent, or Firm*—Katten Muchin Rosenman LLP

(57) ABSTRACT

A parallel operation system of transmission amplifiers enable the parallel running by the two distortion compensation amplifiers using the digital pre-distorter system and to provide a parallel operation system of the transmission amplifiers that makes it possible to switch to respective single running easily. The parallel operation system includes first and second transmission amplifiers which receive common input signals for outputting amplified signals from respective ones; and a coupling unit which combines outputs of the first and second transmission amplifiers, to provide as its output; the first and second transmission amplifiers each having a main amplifier; and a modulation unit disposed on the input side of the main amplifier; wherein the output of one of the modulation units included in the first and second transmission amplifiers is fed in common to the main amplifiers included in the first and second transmission amplifiers.

11 Claims, 12 Drawing Sheets

PARALLEL OPERATION SYSTEM OF TRANSMISSION AMPLIFIER

BACKGROUND OF THE INVENTION

1. Field of the Invention

The present invention relates generally to a parallel operation system of transmission amplifiers, and more particularly to transmission amplifier parallel operation system adapted for a mobile radio base station.

2. Description of the Related Art

With mobile radio communication terminals prevailing in recent years and furthermore demands for high-speed data services rising, increasing the transmission output of base stations has become a greater problem. To increase the transmission output of base stations, high-powered transmission amplifiers are needed and to increase the electric power of transmission amplifiers it is generally necessary to enlarge heat dissipation fins. Therefore it is unavoidable that the configuration of transmission amplifiers becomes big.

On the other hand, when transmission amplifiers are made to perform amplification functions in the nonlinear range of amplification characteristics to obtain high-efficient output, nonlinear distortions arise. To compensate it, feed forward system is generally adopted.

As disclosed in Japan Patent Pub. No. Hei7-77330, for example, the transmission amplifiers adopting the feed forward system are configured such that distortion components are found from the difference between main amplifiers' inputs and outputs, the found distortion components are amplified to the level equivalent to the outputs of the main amplifiers and then added to the outputs of the above main amplifiers, and the found distortion components are canceled. Amplifier outputs with compensated distortions can thus be obtained.

However, the configuration of the transmission amplifiers adopting the feed forward system needs amplifiers for distortion components that amplify the distortion components to the level equivalent to the outputs of the main amplifiers. A delay circuit is also needed to adjust the timing to add the outputs of the amplifiers for distortion components and those of the main amplifiers.

Furthermore, there is a digital pre-distorter system as a method to compensate the nonlinear distortions of high-powered transmission amplifiers. The principle of the digital pre-distorter system is that characteristic components opposite to the distortion characteristics of the amplifiers are prepared on the input sides of the amplifiers through digital processing and these are added beforehand on the input sides of the amplifiers through digital processing. As a result, the distortion components created by the amplifiers themselves are canceled and the amplified outputs free from any distortions can be obtained from the amplifiers.

A configuration example of amplifiers using the digital pre-distorter system has been proposed before by the present applicant (see Japan Patent Laid-open Pub. No. Hei9-69733).

The amplifiers using the digital pre-distorter system don't need the amplifiers for distortion components, compared with the configuration that adopts the feed forward system. Therefore the amplifiers can be constituted easily because there is no need of adjustment to time the outputs of the amplifiers for distortion components and those of the main amplifiers.

On the other hand, mobile radio base stations adopt a redundancy configuration of transmission amplifiers to secure the reliability of devices. By way of example, FIG. 1 shows a redundancy configuration of the transmission amplifiers that adopt the feed forward system.

In FIG. 1, two amplifiers 1 and 2, each of which has distortion compensating function, adopt the above feed forward system and are parallel connected for the redundancy configuration. In normal times, transmission signals are modulated in a modulation unit 3 and its output is two branched in a branching unit 4.

The two branched outputs from the modulation unit 3 are inputted into the transmission amplifiers 1 and 2 respectively and amplified to the respective predetermined levels. The outputs of the transmission amplifiers 1 and 2 are again connected and outputted by a coupling unit 5. Through this in normal times, it is possible to obtain the output power for which the output powers of the transmission amplifiers 1 and 2 are combineed in the coupling unit 5.

Also in the configuration shown in FIG. 1, when either of the systems of the transmission amplifiers 1 and 2 is in trouble, the output power is halved but it is possible to continuously keep the output.

Furthermore, in the configuration shown in FIG. 1, when the output is two branched by the branching unit 4 in normal times, the level is halved (−3 dB). But the output of the modulation unit 3 is distributed in common phase in the branching unit 4 and the respective outputs of the transmission amplifiers 1 and 2 are connected in common phase in the coupling unit 5. Through this in the coupling unit 5, the loss in the branching unit 4 at the time of branching can be canceled. Therefore it is possible to use the outputs of the transmission amplifiers 1 and 2 efficiently also in the parallel configuration.

In FIG. 1, one modulation unit 3 is shown. But for the parallel configuration, two modulation units are prepared and either of the outputs is inputted into the branching unit 4 for redundancy.

As explained earlier, compared with the configuration of the distortion compensation amplifiers of the feed forward system, it seems advantageous to employ the transmission amplifiers using the digital pre-distorter system also in parallel running for the redundancy configuration because the configuration is easy in that neither the amplifiers for the distortion components nor the delay circuit and the like are necessary.

On the basis of such an idea, FIG. 2 shows an assumed configuration example when the transmission amplifiers using the digital pre-distorter system are parallel run. In the case of the transmission amplifiers using the digital pre-distorter system, because modulation units 3-1 and 3-2 where transmission signals are branched and inputted are arranged on preceding stages of the main amplifiers 10-1 and 10-2, the transmission amplifiers 1 and 2 that are parallel run and distortion compensated have the following problems.

That is, the modulation units 3-1 and 3-2 are respectively constituted, including digital pre-distorters (DPDs) 30-1 and 30-2, quadrature modulators (QMODs) 31-1 and 31-2, up-converters (UCONVs) 32-1 and 32-2 and down-converters (DCONVs) 33-1 and 33-2.

In FIG. 2, the up-converters (UCONVs) 32-1 and 32-2 have the function to change frequencies by multiplying carrier frequencies from local oscillators 320-1 and 320-2 in multipliers 321-1 and 321-2. Filters 322-1 and 322-2 are roll off filters to limit bands.

As described above, the two distortion compensation amplifiers 1 and 2 that are parallel run retain local oscillators 320-1 and 320-2 individually to change the frequencies in the respective up-converters (UCONVs) 32-1 and 32-2.

However, the phase difference of the output carriers is not compensated concerning the two local oscillators 320-1 and 320-2. Therefore it is difficult to connect in common phase the outputs of the two transmission amplifiers 1 and 2 in the coupling unit 5. So it is not ensured to compensate in the coupling unit 5 the loss when transmission signals are branch inputted into the transmission amplifiers 1 and 2.

When the transmission amplifiers are redundancy configured to secure the reliability of the device and the digital pre-distorter system is adopted for the transmission amplifiers due to the above reasons, the direct application corresponding to the feed forward system in FIG. 1 was difficult.

SUMMARY OF THE INVENTION

It is therefore the object of the present invention to enable the parallel running by the two distortion compensation amplifiers using the digital pre-distorter system and to provide a parallel operation system of the transmission amplifiers that makes it possible to switch to respective single running easily.

In order to solve the above problems, according to the present invention there is provided a parallel operation system of a transmission amplifier, comprising first and second transmission amplifiers which receive common input signals for outputting amplified signals from respective ones; and a coupling unit which combines outputs of the first and second transmission amplifiers, to provide as its output; the first and second transmission amplifiers each including: a main amplifier; and a modulation unit disposed on the input side of the main amplifier; wherein the output of one of the modulation units included in the first and second transmission amplifiers is fed in common to the main amplifiers included in the first and second transmission amplifiers.

In order to solve the above problems, according to a second aspect of the present invention there is provided a parallel operation system of a transmission amplifier, comprising first and second transmission amplifiers which receive common input signals for outputting amplified signals from respective ones; and a coupling unit which combines outputs of the first and second transmission amplifiers, to provide as its output; the first and second transmission amplifiers each including a main amplifier; a digital pre-distorter disposed on the input side of the main amplifier, for creating distortion anticipated values of the main amplifier to add them to the input signals; a quadrature modulator which quadrature modulates the output of the digital pre-distorter; and an up-converter having a local oscillator, for converting the output frequencies of the quadrature modulator; wherein the output of the up-converter included in one of the first and second transmission amplifiers is fed in common to the main amplifiers included in the first and second transmission amplifiers.

In the parallel operation system of a transmission amplifier according to the second aspect, preferably the first and second transmission amplifiers each have a down-converter, the output of the coupling unit being fed back via the down-converter to the digital pre-distorters included in the above first and second transmission amplifiers.

The parallel operation system of a transmission amplifier according to the second aspect may further comprise a switch interposed between the main amplifier and the up-converter included in each of the first and second transmission amplifiers; the switch being changed over to feed, in common, the output of one of the up-converters included in the first and second transmission amplifiers, to the main amplifiers included in the first and second transmission amplifiers.

In order to solve the above problems, according to the third aspect of the present invention there is provided a parallel operation system of a transmission amplifier, comprising first and second systems each having a digital pre-distorter which receives digital signals, having a D/A converter which converts the output of the digital pre-distorter into an analog signal, and having a main amplifier to amplify the outputs of the D/A converter; a coupling unit which combines the outputs of the main amplifiers of the first and second systems; and a feedback system including a D/A converter which converts the output of the coupling unit into a digital signal, wherein the output of the D/A converter included in the feedback system is fed back to the digital pre-distorters of the first and second systems, and wherein the digital pre-distorters of the first and second systems create distortion anticipated values of the main amplifiers as a function of the fed back output level of the coupling unit and add them to the inputted digital signals, for output.

Further features of the present invention will become more apparent from the embodiments of the present invention which will be described with reference to the following drawings.

DESCRIPTION OF THE PREFERRED EMBODIMENTS

Embodiments of the present invention will now be described with reference to the accompanying drawings. The embodiments described hereinafter are for the understanding of the present invention and the application of the invention is not limited thereto.

Figure 2:
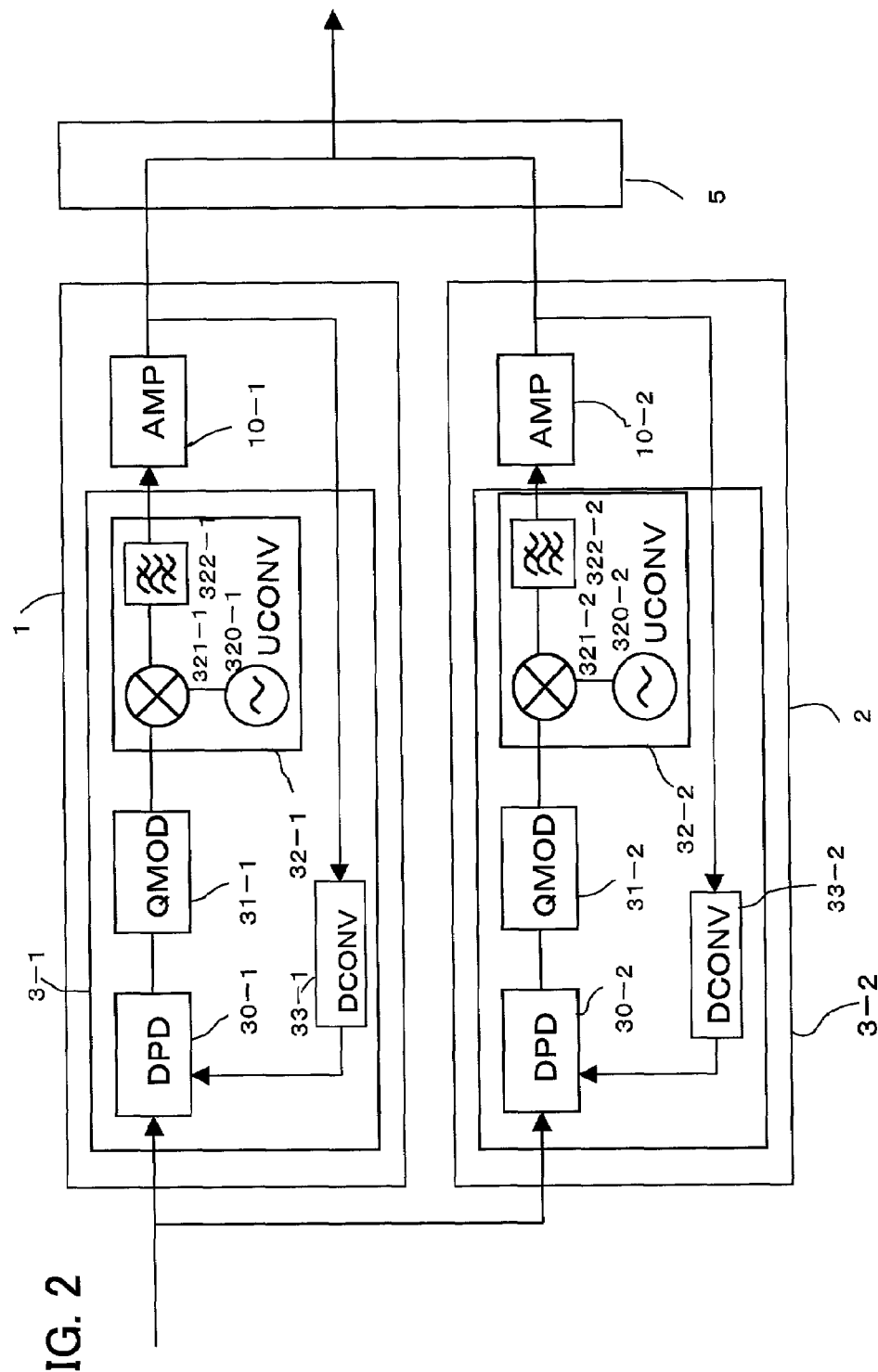
FIG. 2 shows an assumed configuration example when the transmission amplifier using a digital pre-distorter system is in parallel running.
Figure 3:
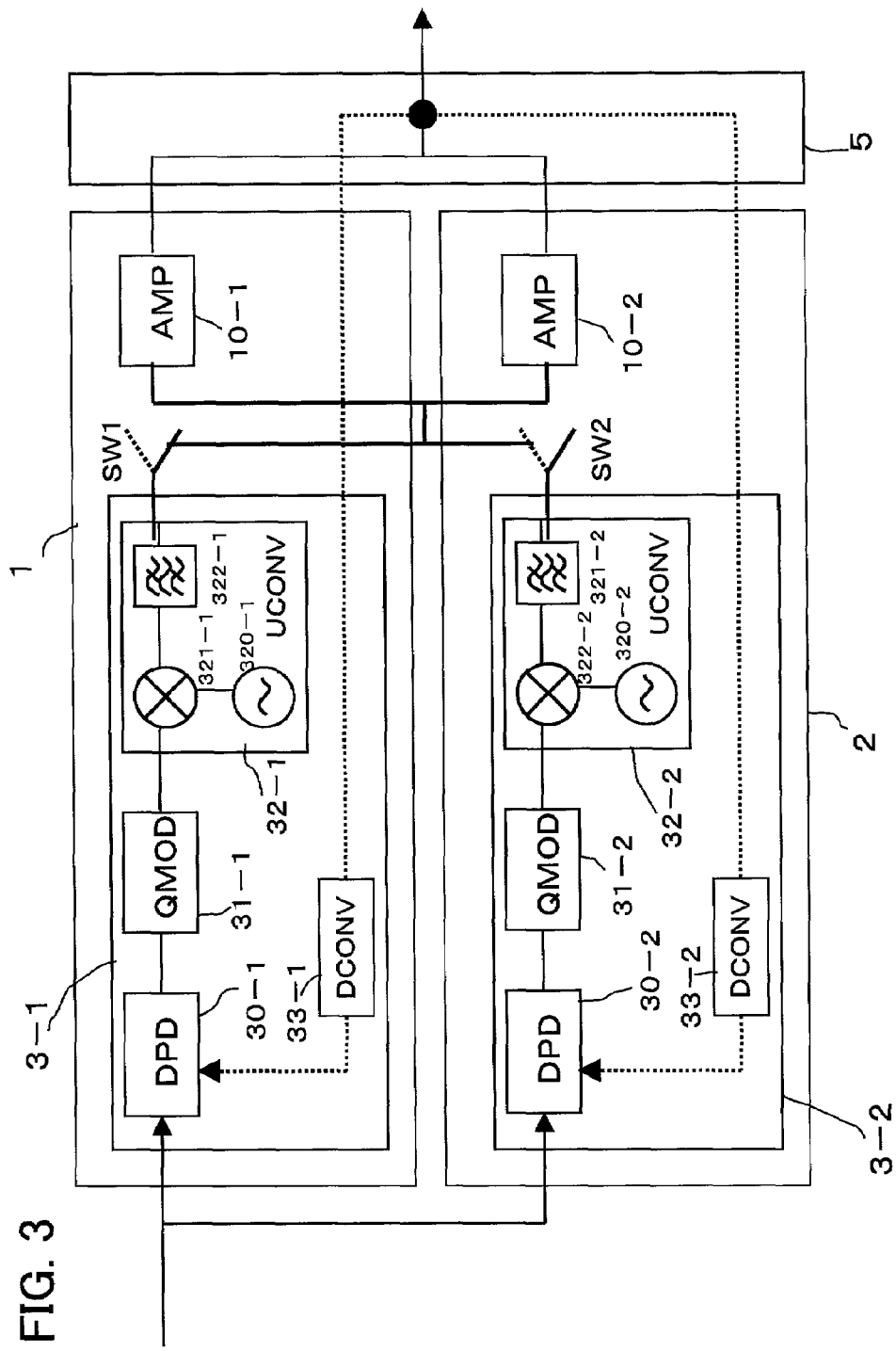
FIG. 3 is a block diagram that shows a basic configuration of the present invention.

FIG. 3 is a block diagram that shows a basic configuration of the present invention. In the redundancy configuration in FIG. 3, a pair of transmission amplifiers 1 and 2 that are parallel run are provided. The different feature from the configuration in FIG. 2 is that between the respective main amplifiers 10-1 and 10-2 and the modulation units 3-1 and 3-2 of the transmission amplifiers 1 and 2, either of the outputs from the modulation unit 3-1 on the transmission amplifier 1 and the modulation unit 3-2 on the transmission amplifier 2 that is in active or current is in common given to the main amplifiers 10-1 and 10-2.

Therefore, though the configuration in FIG. 2 gets feedback outputs that are inputted into the corresponding down-converters 33-1 and 33-2 from the respective main amplifiers 10-1 and 10-2, the embodiment shown in FIG. 3, as another feature, gets feedback outputs that are inputted into the down-converters (DCONVs) 33-1 and 33-2 from the coupling unit 5 that combines the outputs of the transmission amplifiers 1 and 2.

As written, for example, in the Japan Patent Application Hei9-69733 filed by the present applicant, the digital pre-distorters 30-1 and 30-2 constituting the modulation units 3-1 and 3-2 have tables that store compensation values with characteristics opposite to distortion component characteristics for compensating the distortion components added in the corresponding main amplifiers 10-1 and 10-2, and adders that add compensation values to input signals.

The input signals that are outputs from the digital pre-distorters 30-1 and 30-2 and to which compensation values are added are changed to quadrature modulation signals in quadrature modulators 31-1 and 31-2. The quadrature modulation signals are changed to carrier frequencies in the up-converters 32-1 and 32-2 and inputted into the main amplifiers 10-1 and 10-2 and then amplified and given distortions in the main amplifiers 10-1 and 10-2, which is canceled by the above compensation values. As a result it is possible to get amplified outputs without distortions.

Furthermore as described above, the outputs of the down-converters 33-1 and 33-2 are inputted into the digital pre-distorters (DPDs) 30-1 and 30-2. Through this in the digital pre-distorters 30-1 and 30-2, it is possible to adaptively anticipate and create amplifier distortions in accordance with the combined outputs of the main amplifiers 10-1 and 10-2.

As explained above in FIG. 3, switches SW 1 and SW 2 are provided between the modulation units 3-1 and 3-2 and the main amplifiers 10-1 and 10-2 as an embodiment to give in common to the main amplifiers 10-1 and 10-2 either active or current output of the modulation unit 3-1 on the transmission amplifier 1 side and of the modulation unit 3-2 on the transmission amplifier 2 side.

Switches SW 1 and SW 2 are respectively closed or open in accordance with normal or unusual detections of the systems monitored by a monitoring unit that is omitted in the figure so that the output of the active or current modulation unit (the modulation unit 3-1 of the transmission amplifier 1 in the example of FIG. 3) may be supplied in common to the main amplifiers 10-1 and 10-2.

As described above, only one of the outputs of the modulation units 3-1 and 3-2 is given to the main amplifiers 10-1 and 10-2. Therefore either of the local oscillators 320-1 and 320-2, the corresponding side, is concerned in the output phases of the main amplifiers 10-1 and 10-2. For this reason, it is easy to combine the output phases of the main amplifiers 10-1 and 10-2 in common phase in the coupling unit 5.

Figure 1:
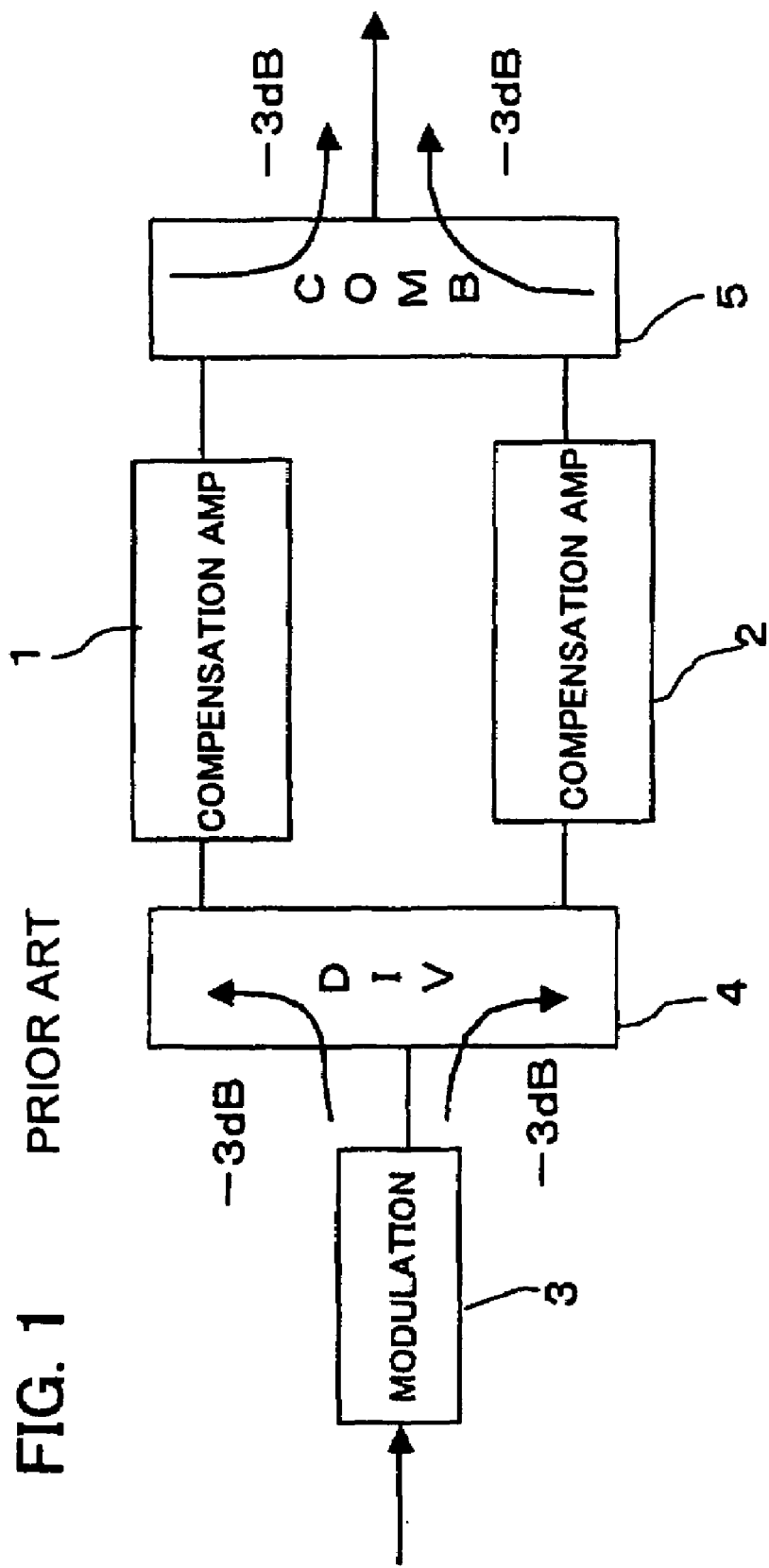
FIG. 1 shows a redundancy configuration example of a transmission amplifier that adopts a feed forward system.

Therefore like the feed forward system shown in FIG. 1, the parallel running of the transmission amplifiers 1 and 2 through common phase distribution and common phase composition is possible.

Figure 4:
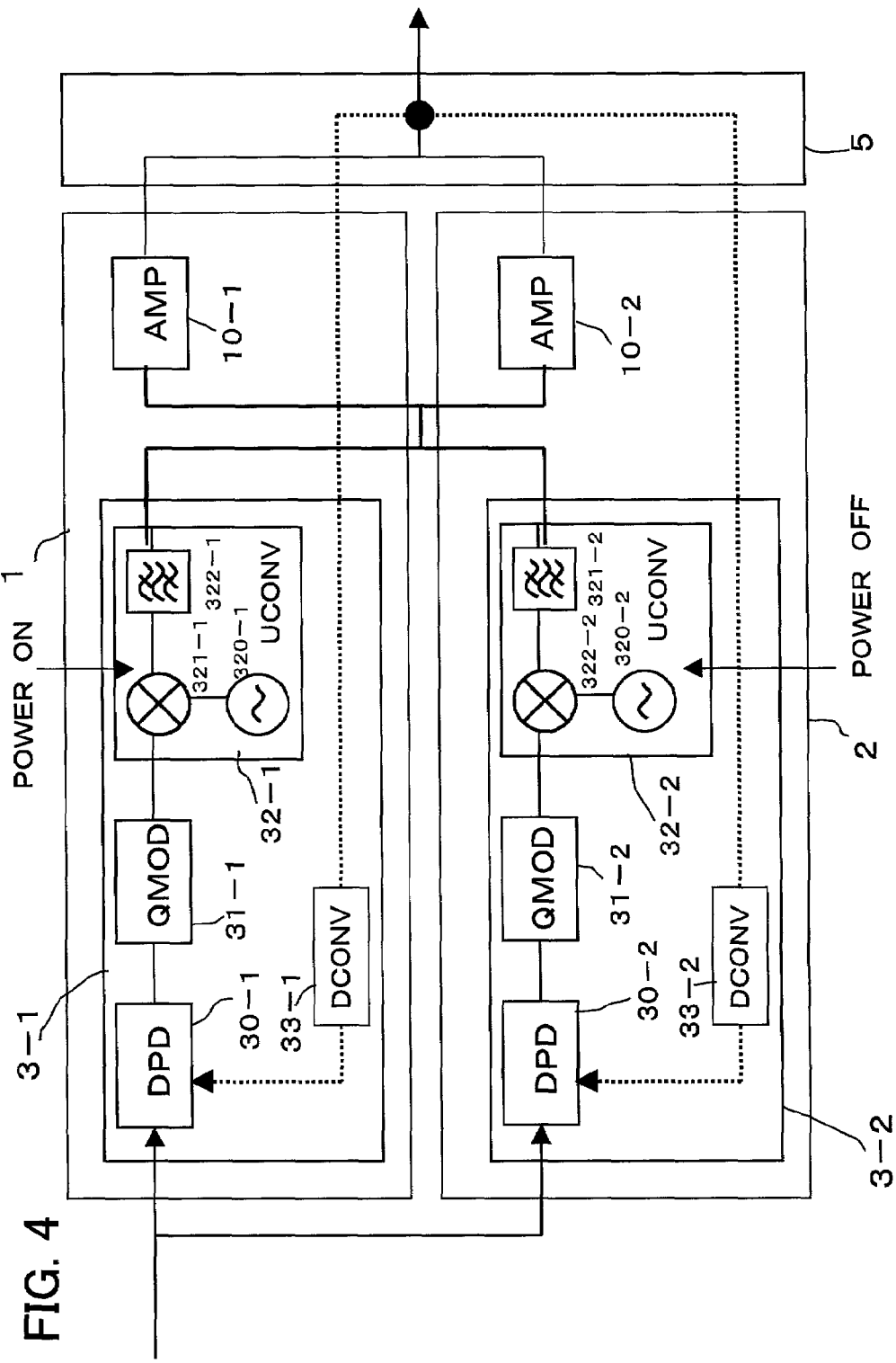
FIG. 4 shows an embodiment where the output of one in current use of modulation units of FIG. 3 is shared to main amplifiers.

FIG. 4 is another embodiment to give in common to the main amplifiers 10-1 and 10-2 either of the outputs that is active or current of the modulation unit 3-1 on the side of the transmission amplifier 1 and the modulation unit 3-2 on the side of the transmission amplifier 2, which is a basic configuration of the present invention as explained in FIG. 3 above.

In the embodiment shown in FIG. 4, power supply to either of the up-converters 32-1 and 32-2 is stopped. There is no output from the side where power supply is stopped and only the output from the other up-converter is supplied to the main amplifiers 10-1 and 10-2. Therefore it is easy to combine the outputs of the main amplifiers 1 and 2 in common phase in the coupling unit 5.

In FIG. 4, the control to stop power supply to either of the up-converters 32-1 and 32-2 is carried out in accordance with the normal or unusual detections of the systems monitored by the monitoring unit omitted in the figure, as explained above concerning FIG. 3.

Figure 5:
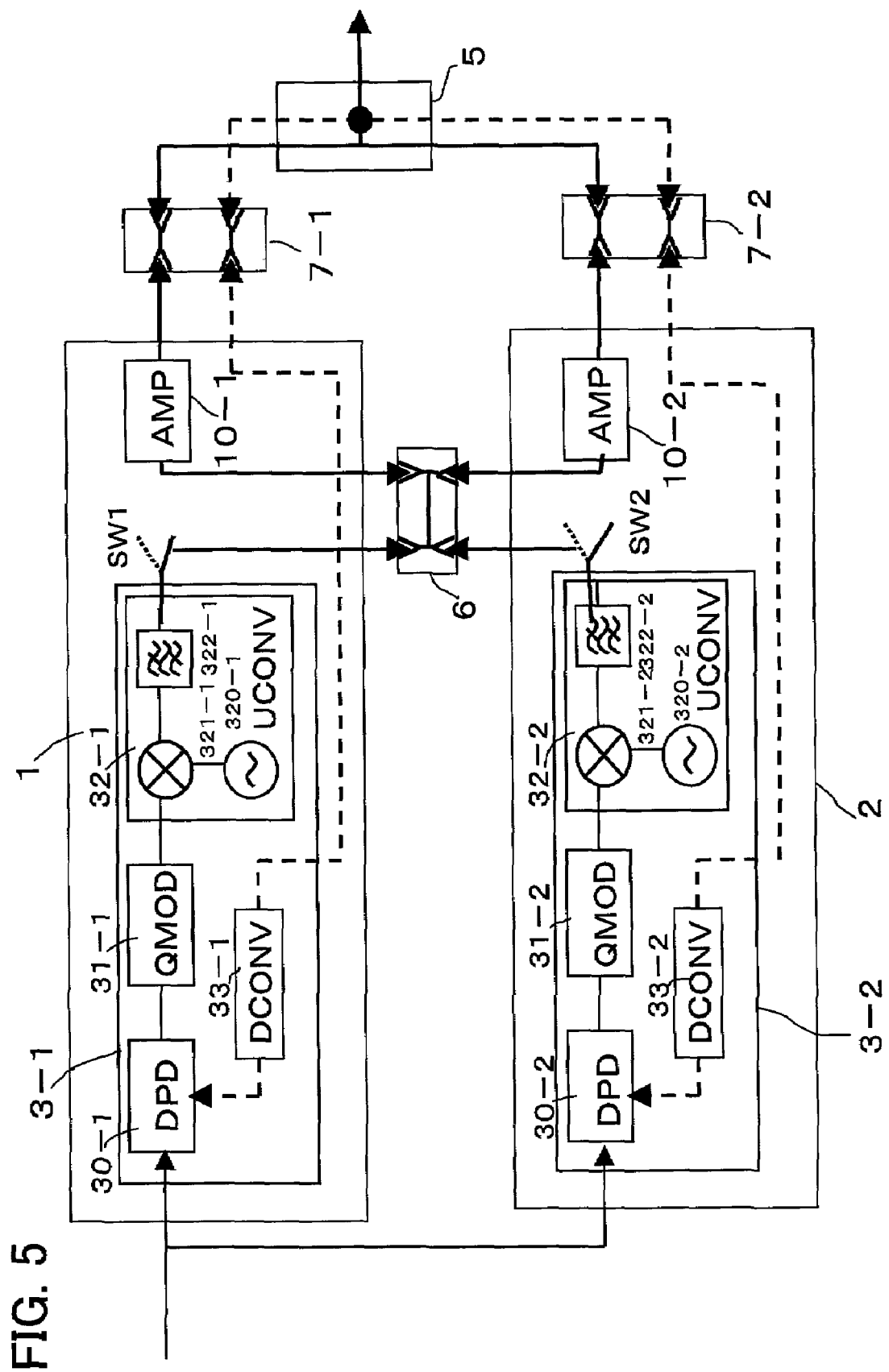
FIG. 5 shows a configuration of an example to more concretely constitute the embodiments in FIGS. 3 and 4.

FIG. 5 shows the configuration of one embodiment to constitute more concretely the embodiments shown in FIGS. 3 and 4.

That is, in the embodiment shown in FIG. 5, external connectors 6 and 7 are provided outside the transmission amplifiers 1 and 2 (as an example, a pair of connectors 7-1 and 7-2 are shown). The external connectors can be constituted in the form of divider (DIV) or U link.

Using the external connectors 6 and 7 makes it possible to easily change to single or parallel amplification running by separating independently or connecting the transmission amplifiers 1 and 2. Especially when the transmission amplifiers 1 and 2 are housed on housing, with the external connectors 6 and 7 installed at the back panel of the above housing, operators can easily change to the single or parallel amplification running only by changing the connection of the connectors.

Figure 6:
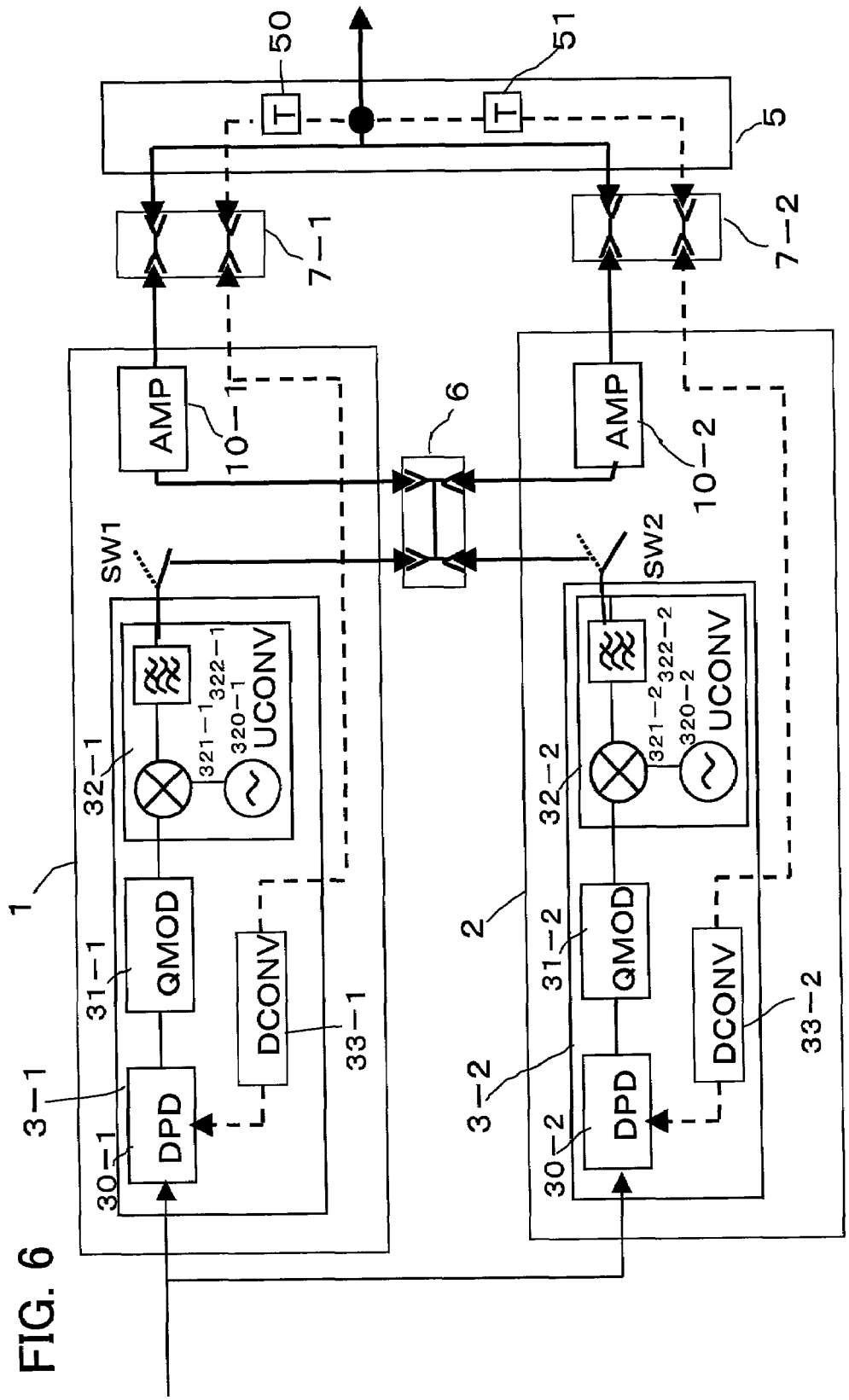
FIG. 6 shows a configuration of an embodiment where distortion compensation in the digital pre-distorters is made adaptive through feedback of transmission outputs to the modulation units 3-1 and 3-2.

FIG. 6 shows a configuration example where the attenuators 50 and 51 are inserted in coupling unit 5 in the configuration of FIG. 5 to deal with the level fluctuations of the feedback outputs to down-converters 50 and 51 when single or parallel amplification running is carried out by separating independently or connecting the transmission amplifiers 1 and 2.

Figure 7:
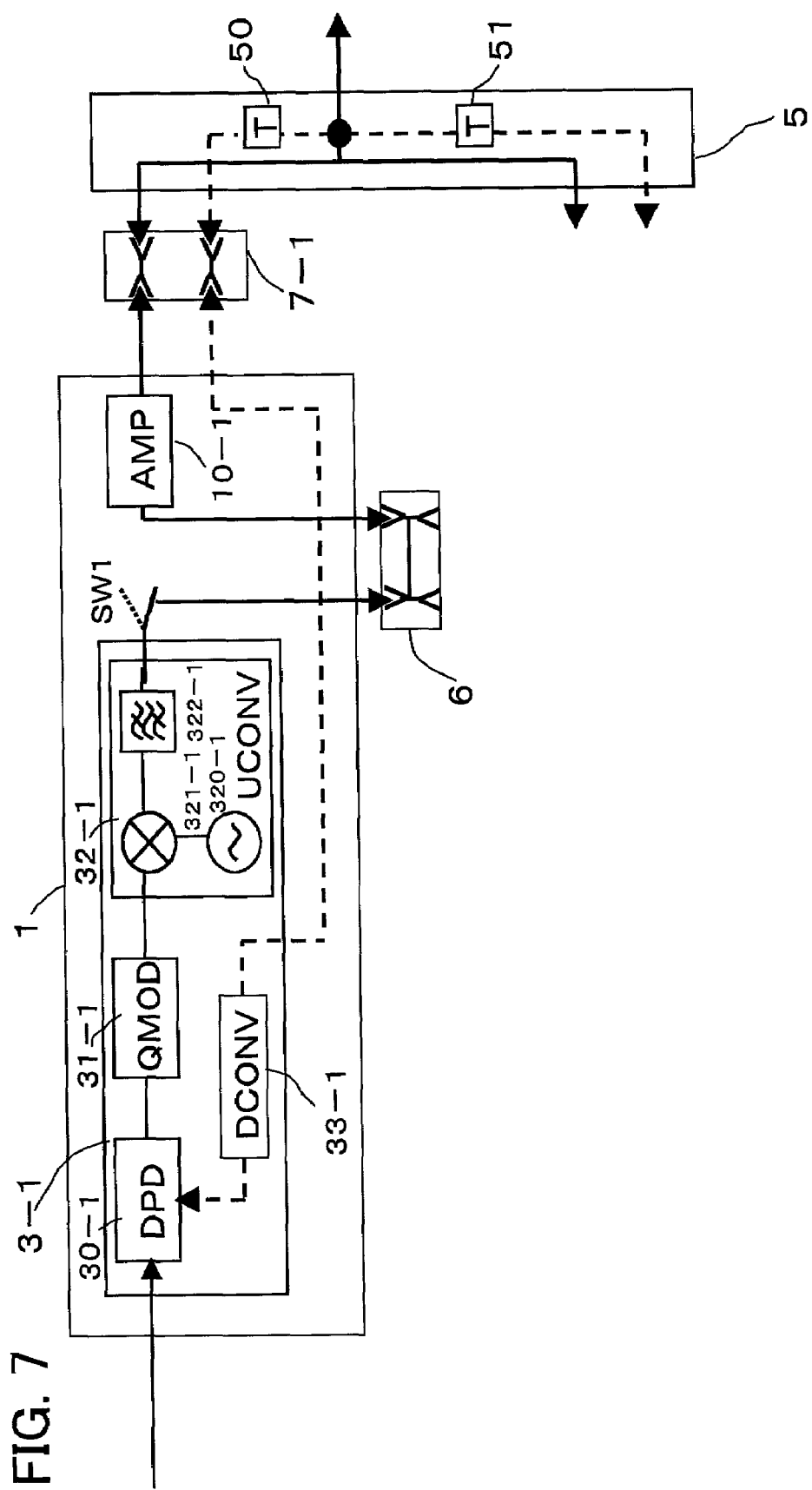
FIG. 7 shows a configuration of an embodiment where attenuators 50 and 51 with the attenuation quantity of 3 dB are provided in the coupling unit 5 in FIG. 6.

That is, FIG. 6 shows a configuration where parallel amplification is carried out by combining the outputs of the transmission amplifiers 1 and 2 in the coupling unit 5. On the other hand, the configuration shown in FIG. 7 is an example where single running only by transmission amplifier 1 is carried out with the transmission amplifier 2 separated by the external connectors 6 and 7-2.

The output of the coupling unit 5 shown in FIG. 5 is a combined output of the main amplifiers 1 and 2. On the other hand, the output of the coupling unit 5 shown in FIG. 7 is an output of only the main amplifier 1. Thus, the output of the coupling unit 5 that is fed back to the down-converter 33-1 in FIG. 6 is double the output of the coupling unit 5 that is fed back to the down-converter 33-1 in FIG. 7.

Therefore the digital pre-distorter 30-1 outputs a distortion anticipated value of the main amplifier 10-1 in accordance with different outputs of the coupling unit 5 in parallel or single operation. To avoid such a problem, the attenuation quantity of the attenuator 50 is changed in parallel or single running. That is, the attenuator 50 in FIG. 7 is set to give a half attenuation quantity (−3 dB) of that in parallel running in FIG. 6. This makes it possible for the digital pre-distorter 30-1 to accurately create the distortion anticipated value for the output of the main amplifier 10-1 whether in single or parallel running.

It is possible to place the attenuators 50 and 51 that are in the coupling unit 5 in FIG. 6 on either the input or output side of the down-converters 33-1and 33-2 in the modulation units 3-1 and 3-2.

Figure 8:
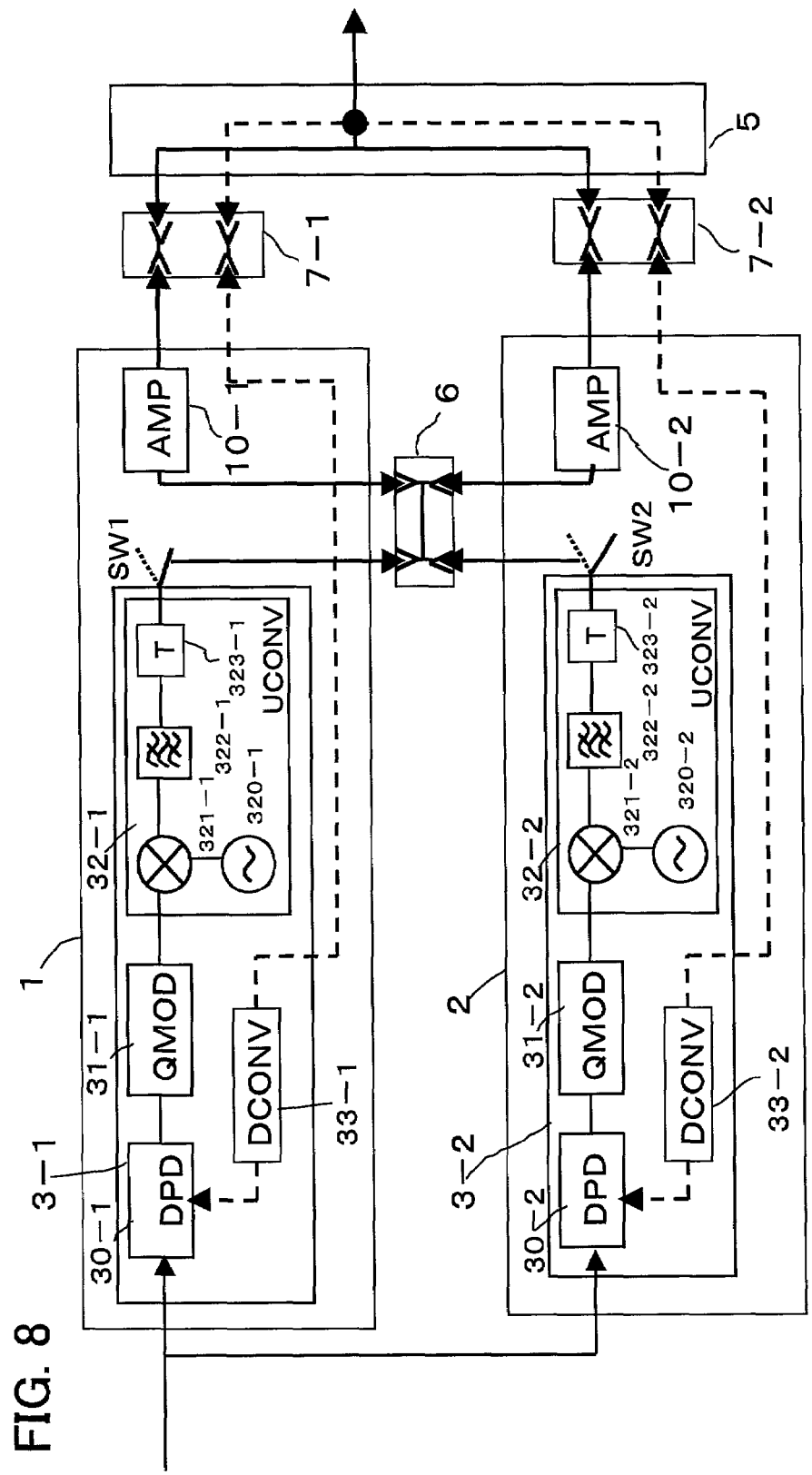
FIG. 8 shows an example of the state where a transmission amplifier 1 is in single operation in the embodiment in FIG. 7.

FIG. 8 shows another embodiment. This is a configuration where the variable attenuators 323-1 and 323-2 are provided on the output sides of the up-converters 32-1 and 32-2. When the transmission amplifiers 1 and 2 are changed from active or current system to in active or spare system or there are breakdowns in the main amplifiers 10-1 and 10-2, the attenuation quantities of the variable attenuators 323-1 and 323-2 are increased through detecting the discontinuity of the feedback signals to the down-converters from the coupling unit 5. Then the attenuation quantities are gradually returned to stationary values. This makes it possible to prevent the distortion increase in transient response during the changing operation of transmission amplifiers due to breakdowns.

Figure 9:
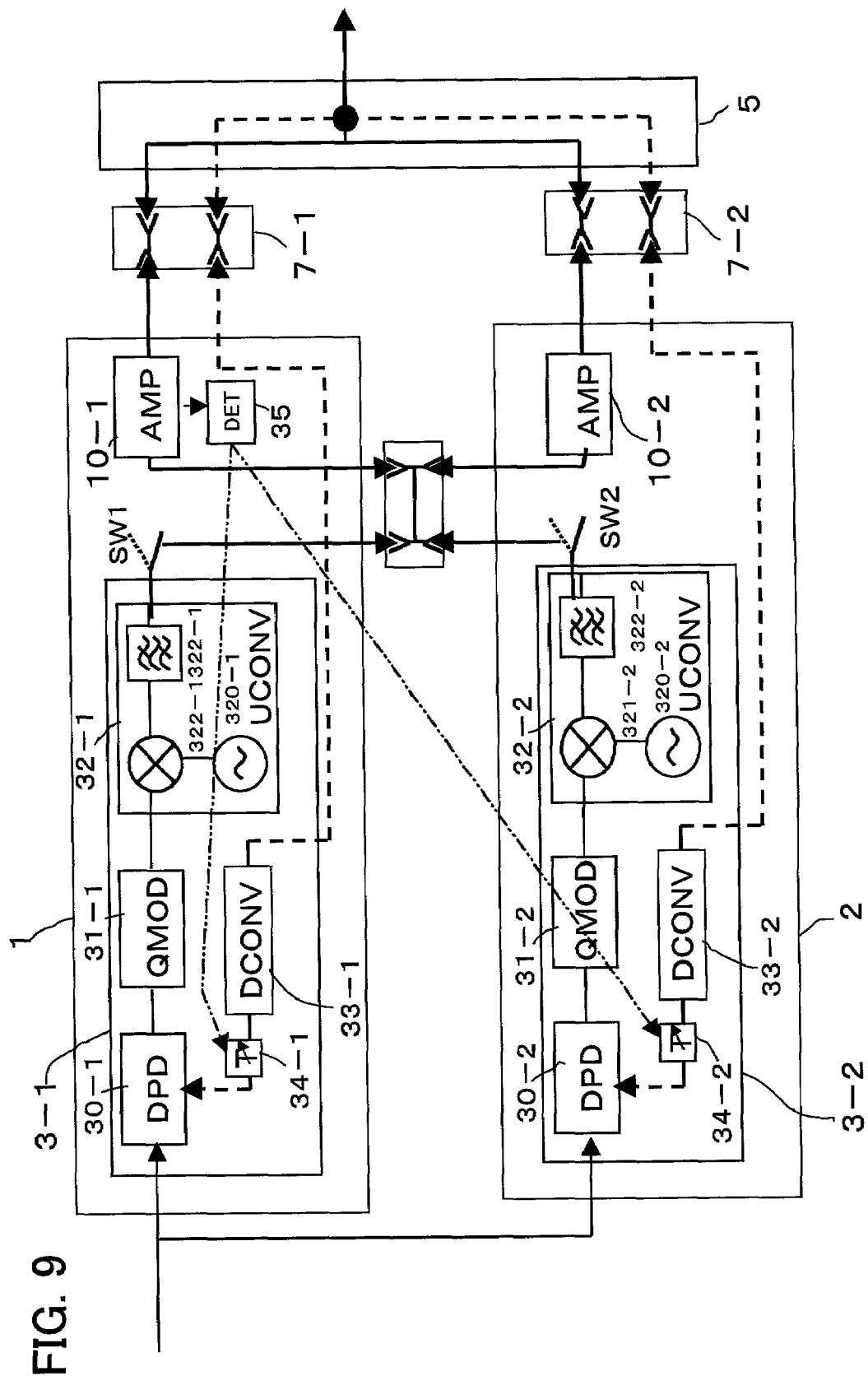
FIG. 9 shows a configuration example where the FIG. 6 embodiment further has a trouble detecting function.

FIG. 9 shows still another embodiment. This is a configuration that has a function to detect breakdowns of the main amplifiers 10-1 and 10-2. In FIG. 9, only a detector 35 that detects breakdowns of the main amplifier 10-1 on the transmission amplifier 1 side is shown to make the figure concise, but actually a detector that detects breakdowns of the main amplifier 2 on the transmission amplifier 2 side is necessary.

Furthermore the variable attenuators 34-1 and 34-2 are provided between the down-converters 33-1 and 33-2 and the digital pre-distorters 30-1 and 30-2. The attenuators 34-1 and 34-2 on one's own and spare systems are controlled through detecting the breakdowns of the main amplifier 10-1 with the detector 35. As embodiment, set the attenuation quantities of the variable attenuators 34-1 and 34-2 at 0 dB when the main amplifiers 10-1 and 10-2 are in trouble and at 6 dB in normal times. This makes it possible to stabilize feedback signals and to prevent the occurrence of excessive distortions.

The reason to also control the attenuator on the in active or spare side is to make it always know the output level. This increases the stability when systems are changed.

Figure 10:
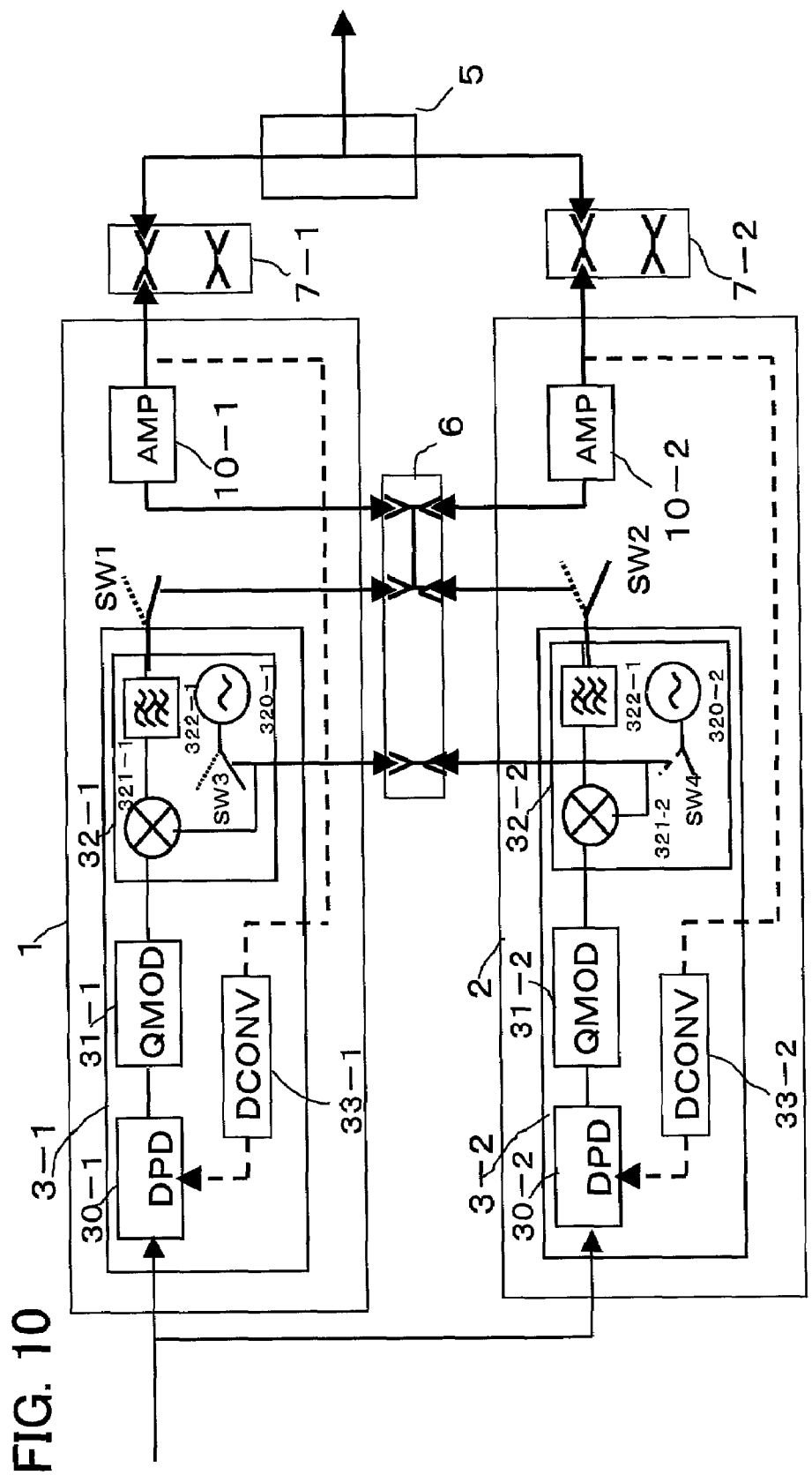
FIG. 10 shows a configuration example where local oscillators 320-1 and 320-2 of up-converters 32-1 and 32-2 are shared.

FIG. 10 shows another embodiment. This is a configuration example where the local oscillators 320-1 and 320-2 of the up-converters 32-1 and 32-2 are made common to the up-converters 32-1 and 32-2.

Switches SW3 and SW4 are provided in the up-converters 32-1 and 32-2 respectively and the local oscillators 320-1 or 320-2 on the active or current side is also supplied to the in active or spare system so that the common oscillator may be used by both the main amplifiers 10-1 and 10-2. This makes the output phases of the main amplifiers 10-1 and 10-2 common phase easily.

Therefore the feedback inputs to the down-converters 33-1 and 33-2 are not from the coupling unit 5 but the outputs of the respective main amplifiers can be fed back.

Figure 11:
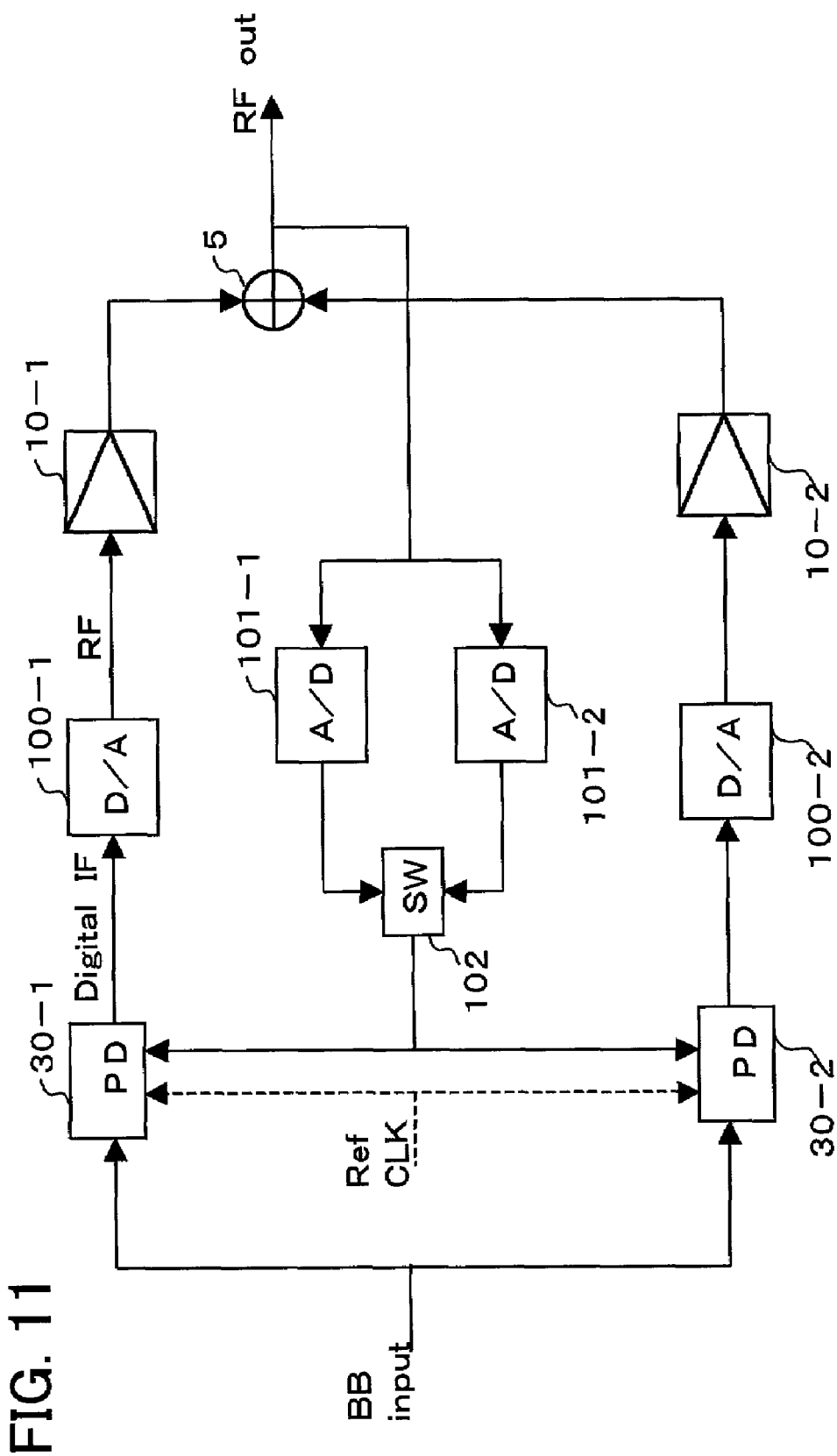
FIG. 11 shows an embodiment where inputted signals are digital and shows a configuration that has one feedback system to the digital pre-distorters.

FIG. 11 is another embodiment of the present invention. Each of the above embodiments has two systems where the outputs of the coupling unit 5 or the main amplifiers 10-1 and 10-2 are fed back to each of the down-converters 33-1 and 33-2 of the modulation units 3-1 and 3-2.

On the other hand in FIG. 11, there are a system that has the digital pre-distorter 30-1, a D/A converter 100-1 and the main amplifier 10-1, another system that has the digital pre-distorter 30-2, a D/A converter 100-2 and the main amplifier 10-2, and one feedback system.

The above feedback system has the A/D converters 101-1 and 101-2 in redundancy configuration and a switch 102 that chooses one of the outputs from the converters.

In FIG. 11, digital baseband input signals are inputted into the digital pre-distorters 30-1 and 30-2. In the digital pre-distorter 30-1, input signal frequencies are changed until those in IF band on the basis of basic clock (Ref CLK).

The distortion anticipated values of the main amplifiers 10-1 and 10-2 are created and added to the gradually multiplied input signals, based on the feedback signals of the RF signal outputs of the coupling unit 5 that are inputted through the switch 102.

The input signals that distortion anticipated values are added to are inputted into D/A converters 100-1 and 100-2. The D/A converters 100-1 and 100-2 change those to analog signals in RF band and input them into the main amplifiers 10-1 and 10-2.

The outputs of the main amplifiers 10-1 and 10-2 are combined in coupling unit 5 and outputted (RF outputted), and at the same time are inputted into the A/D converters 101-1 and 101-2 in redundancy configuration as feedback signals. Either of the outputs of the A/D converters 101-1 and 101-2 that is current is chosen and outputted and, as explained above, is inputted into the digital pre-distorters 30-1 and 30-2.

Figure 12:
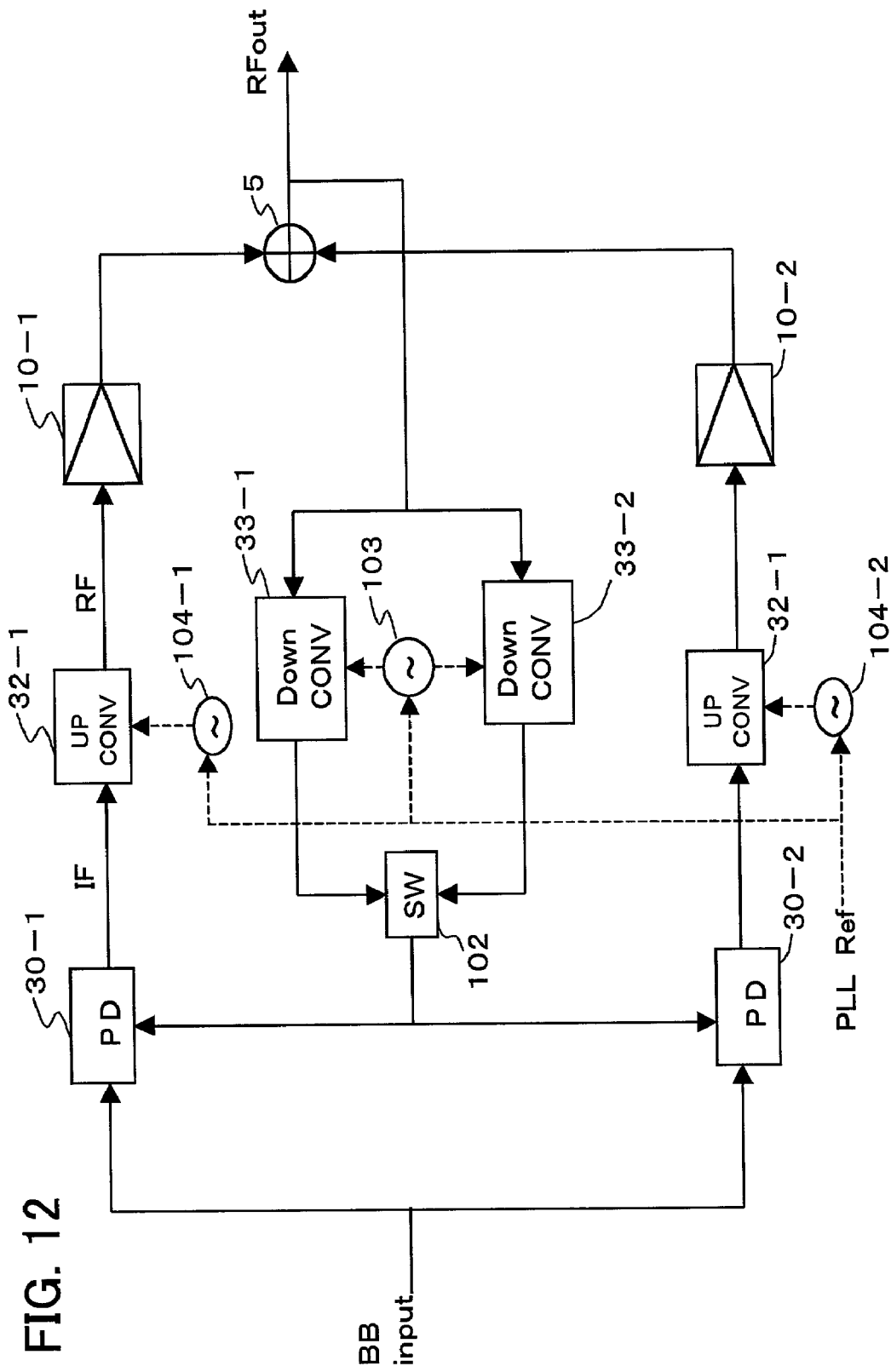
FIG. 12 is an embodiment corresponding to FIG. 11 where inputted signals are analog signals and shows a configuration that has one feedback system to the digital pre-distorters.

FIG. 12 is an embodiment corresponding to the configuration in FIG. 11 where the baseband input signals are analog.

There are a system that has the pre-distorter 30-1, the up-converter 32-1 and the main amplifier 10-1, another system that has the pre-distorter 30-2, the up-converter 32-2 and the main amplifier 10-2, and one feedback system.

The above feedback system has the down-converters 33-1 and 33-2 in redundancy configuration and the switch 102 that chooses either of their outputs.

In FIG. 12, analog baseband input signals are inputted into the pre-distorters 30-1 and 30-2. The analog input signals are changed to frequencies in IF band in the pre-distorter 30-1.

The distortion anticipated values of the main amplifiers 10-1 and 10-2 are created and added to the analog input signals changed to frequencies in IF band, based on the feedback signals of the RF signal outputs of the coupling unit 5 inputted through the switch 102.

The input signals that distortion anticipated values are added to are inputted into the up-converters 32-1 and 32-2. The up-converters 32-1 and 32-2 frequency change these to predetermined analog signals in RF band and input them to the main amplifiers 10-1 and 10-2.

The outputs of the main amplifiers 10-1 and 10-2 are combined in the coupling unit 5 and outputted (RF outputted), and at the same time inputted into the down-converters 33-1 and 33-2 in redundancy configuration as feedback signals. By switch 102, the gradually frequency decreased output from either of the down-converters 33-1 and 33-2 that is active or current is chosen and outputted, and as explained above, inputted into the pre-distorters 30-1 and 30-2.

In the embodiment shown in FIG. 12, common reference signals that are phase fixed are supplied to the local oscillators 104-1 and 104-2 for the up-converters 32-1 and 32-2, and also to the local oscillator 103 for the down-converters 33-1 and 33-2.

Because this makes the up-converters 32-1 and 32-2 and down-converters 33-1 and 33-2 synchronized by the common basic signals, it is easy to put the output phases of the main amplifiers 10-1 and 10-2 in phase.

According to the embodiments set forth hereinabove with reference to the drawings, the present invention can provide a parallel operation system of a transmission amplifier, that makes possible the parallel running by the distortion compensation amplifiers using the digital pre-distorter system.

What is claimed is:

1. A parallel operation system of transmission amplifiers, comprising:
    first and second transmission amplifier units which receive a common input signal and output respective amplified signals; and
    a coupling unit which combines outputs of the first and second transmission units, to provide as its output;
    the first and second transmission amplifier units each including:
    a main amplifier; and
    a modulation unit disposed on the input side of tire main amplifier; wherein
    the output of either one of the modulation units included in the first and second transmission amplifier units is fed commonly to the main amplifiers included in the first and second transmission amplifier units.

2. The parallel operation system of transmission amplifiers according to claim 1, further comprising a switch interposed between the main amplifier and the modulation unit included in each of the first and second transmission amplifier units; the switch being changed over to feed the output of either one of the modulation units included in the first and second transmission amplifiers commonly to the main amplifiers included in the first and second transmission amplifier units.

3. The parallel operation system of transmission amplifiers according to claim 1, further comprising:
    an external connector to provide a connection or disconnection between the first transmission amplifier unit, the second transmission amplifier unit, and the coupling unit that combines the outputs of the first and second transmission amplifier units, for the output, to thereby effect a switching between the parallel running and the single running.

4. A parallel operation system of transmission amplifiers, comprising:
    first and second transmission amplifier units which receive a common input signal and output respective amplified signals; and
    a coupling unit which combines outputs of the first and second transmission amplifier units, to provide as its output;
    the first and second transmission amplifier units each including:
    a main amplifier;
    a digital pre-distorter disposed on the input side of the main amplifier, for creating distortion anticipated values of the main amplifier to add them to the input signals;
    a quadrature modulator which quadrature modulates the output of the digital pre-distorter; and
    an up-converter having a local oscillator, for converting the output frequencies of the quadrature modulator; wherein
    the output of the up-converter included in one of the first and second transmission amplifier units is fed commonly to the main amplifiers included in the first and second transmission amplifier units.

5. The parallel operation system of transmission amplifiers according to claim 4, wherein
    the first and second transmission amplifier units each have a down-converter, the output of the coupling unit being fed back via the down-converter to the digital pre-distorters included in the above first and second transmission amplifier units.

6. The parallel operation system of a transmission amplifier according to claim 5, further comprising:
    an attenuator for adjusting the difference between feedback signal levels to the digital pre-distorter in the parallel and single running.

7. The parallel operation system of a transmission amplifier according to claim 5, further comprising, on the output side of the up-converter, an attenuator for adjusting the difference between feedback signal levels to the digital per-distorter in the parallel and single running.

8. The parallel operation system of transmission amplifiers according to claim 4, further comprising a switch interposed between the main amplifier and the up-converter included in each of the first and second transmission amplifier units; the switch being changed over to feed the output of either one of the up-converters included in the first and second transmission amplifiers commonly to the main amplifiers included in the first and second transmission amplifier units.

9. The parallel operation system of transmission amplifiers according to claim 4, wherein
    power is supplied to only one of the up-converters included in the first and second transmission amplifier units, the output of the power supplied up-converter being fed in common to the main amplifiers included in the first and second transmission amplifier units.

10. A parallel operation system of transmission amplifiers, comprising:
    first and second systems each having a digital pre-distorter which receives digital signals, having a D/A converter which converts the output of the digital pre-distorter into an analog signal, and having a main amplifier to amplify the outputs of the D/A converter;
    a coupling unit which combines the outputs of the main amplifiers of the first and second systems; and
    a feedback system including an A/D converter which converts the output of the coupling unit into a digital signal, wherein
    the output of the A/D converter included in the feedback system is fed back to the digital pre-distorters of the first and second systems, and wherein
    the digital pre-distorters of the first and second systems create distortion anticipated values of the main amplifiers as a function of the fed back output level of the coupling unit and add them to the inputted digital signals, for output.

11. A parallel operation system of transmission amplifiers, comprising:
    first and second systems each having a pre-distorter which receives analog signals, having an up-converter which multiplies the output of the pre-distorter up to a pre determined frequency, and having a main amplifier which amplifies the output of the up-converter;

a coupling unit which combines the outputs of the main amplifiers of the first and second systems; and a feedback system including a down-converter which reduces the output of the coupling unit into a predetermined frequency, wherein a common reference signal is fed to both the up-converter and the down-converter, and wherein the output of the down-convener included in the feedback system is fed back to the pie-distorters of the first and second systems, and wherein the pre-distorters of the first and second systems create distortion anticipated values of the main amplifiers as a function of the fed back output level of the coupling unit and add them to the inputted analog signals, for output.

* * * * *